(12) United States Patent
Shibuya et al.

(10) Patent No.: US 10,471,565 B2
(45) Date of Patent: Nov. 12, 2019

(54) POLISHING APPARATUS FOR A WORK WITH MECHANICAL POLISHING FUNCTION AND CHEMICAL POLISHING FUNCTION

(71) Applicant: FUJIKOSHI MACHINERY CORP., Nagano-shi, Nagano (JP)

(72) Inventors: Kazutaka Shibuya, Nagano (JP); Yoshio Nakamura, Nagano (JP)

(73) Assignee: FUJIKOSHI MACHINERY CORP., Nagano-Shi, Nagano (JP)

( * ) Notice: Subject to any disclaimer, the term of this patent is extended or adjusted under 35 U.S.C. 154(b) by 483 days.

(21) Appl. No.: 15/224,064

(22) Filed: Jul. 29, 2016

(65) Prior Publication Data

US 2016/0332278 A1 Nov. 17, 2016

Related U.S. Application Data

(62) Division of application No. 14/637,546, filed on Mar. 4, 2015, now Pat. No. 9,431,262.

(30) Foreign Application Priority Data

Mar. 14, 2014 (JP) .................................. 2014-051394

(51) Int. Cl.
*B24B 37/04* (2012.01)
*H01L 21/306* (2006.01)
(Continued)

(52) U.S. Cl.
CPC .............. *B24B 37/04* (2013.01); *B24B 57/02* (2013.01); *C23F 1/08* (2013.01); *C23F 1/12* (2013.01); *C23F 1/14* (2013.01); *H01J 37/32055* (2013.01); *H01J 37/32073* (2013.01); *H01J 37/32348* (2013.01); *H01L 21/02024* (2013.01); *H01L 21/30625* (2013.01);
(Continued)

(58) Field of Classification Search
None
See application file for complete search history.

(56) References Cited

U.S. PATENT DOCUMENTS 6,352,469 B1 3/2002 Miyazaki et al.
2002/0173149 A1 11/2002 Yanagisawa et al.
(Continued)

FOREIGN PATENT DOCUMENTS

JP 2008-235357 A 10/2008
JP 2009-111094 A 5/2009
(Continued)

OTHER PUBLICATIONS

Extended European Search Report for European Application No. 15158814.2, dated Jul. 22, 2015.

*Primary Examiner* — Sylvia MacArthur
(74) *Attorney, Agent, or Firm* — Birch, Stewart, Kolasch & Birch, LLP

(57) ABSTRACT

The method of the present invention is capable of polishing a high hardness work at high polishing efficiency. The method comprises the steps of: pressing a surface of the work onto a polishing part of a rotating polishing plate; and supplying slurry while performing the pressing step. The method is characterized in that an activated gas, which has been activated by gas discharge, is turned into bubbles and mixed into the slurry.

9 Claims, 4 Drawing Sheets

(51) Int. Cl.
  *B24B 57/02*   (2006.01)
  *C23F 1/08*    (2006.01)
  *C23F 1/12*    (2006.01)
  *C23F 1/14*    (2006.01)
  *H01L 21/67*   (2006.01)
  *H01J 37/32*   (2006.01)
  *H01L 21/02*   (2006.01)
  *H01L 29/16*   (2006.01)
  *H01L 29/20*   (2006.01)

(52) U.S. Cl.
  CPC .. *H01L 21/67075* (2013.01); *H01L 21/67092* (2013.01); *H01L 29/1602* (2013.01); *H01L 29/1608* (2013.01); *H01L 29/2003* (2013.01)

(56) References Cited

U.S. PATENT DOCUMENTS

| | | |
|---|---|---|
| 2004/0142040 A1 | 7/2004 | Dong et al. |
| 2004/0198190 A1 | 10/2004 | Basol et al. |
| 2008/0227297 A1 | 9/2008 | Matsui et al. |
| 2010/0003807 A1 | 1/2010 | Nagaseki |
| 2016/0332278 A1* | 11/2016 | Shibuya ............ H01J 37/32055 |

FOREIGN PATENT DOCUMENTS

| | | |
|---|---|---|
| JP | 2010-188473 A | 9/2010 |
| JP | 2013-43239 A | 3/2013 |

* cited by examiner

POLISHING APPARATUS FOR A WORK WITH MECHANICAL POLISHING FUNCTION AND CHEMICAL POLISHING FUNCTION

CROSS-REFERENCE TO RELATED APPLICATION

This application is a Divisional of co-pending application Ser. No. 14/637,546, filed on Mar. 4, 2015, which claims the benefit of priority of the prior Japanese Patent Application No. 2014-051394, filed on Mar. 14, 2014, and the entire contents of which are incorporated herein by reference.

FIELD

The present invention relates to a method for suitably polishing a work composed of a high hardness material, e.g., SiC, and a work polishing apparatus for suitably polishing the same.

BACKGROUND

Flattening substrates is essential for producing semiconductor power devices. However, substrates of wide band gap semiconductors composed of, for example, silicon carbide (SiC), gallium nitride (GaN), diamond, are hard and fragile, so it is difficult to efficiently flatten said substrates by mechanical processing.

Patent Document 1 discloses a manner of using slurry including abrasive particles and micro-nano bubble water.

Further, Patent Document 2 discloses a polishing method for reducing polishing defects and polishing works at a high polishing rate, in which a first processing liquid including abrasive particles and a second processing liquid including electrolytes and micro-nano bubbles having diameters of 10 nm-1000 μm are used.

PRIOR ART DOCUMENTS

Patent Document 1: Japanese Laid-open Patent Publication No. 2009-111094
Patent Document 2: Japanese Laid-open Patent Publication No. 2008-235357

SUMMARY

In the technologies disclosed in Patent Documents 1 and 2, micro-nano bubbles are included in the slurry or the processing liquid so as to improve polishing rate and reduce polishing defects. However, it is difficult to polish materials having high hardness and processing resistance, e.g., SiC, diamond, at an efficient polishing rate even by the technologies disclosed in said patent documents.

The present invention has been performed to solve the above described problem of the conventional technologies. Accordingly, it is an object to provide a method and an apparatus for polishing a work, which are capable of polishing high hardness materials at high polishing efficiency.

To achieve the object, the present invention has following constitutions.

Namely, the polishing method of the present invention comprises the steps of:
pressing a surface of the work onto a polishing part of a rotating polishing plate; and
supplying slurry while performing the pressing step, and the method is characterized in that an activated gas, which has been activated by gas discharge, is turned into bubbles and mixed into the slurry.

In the method, the activated gas may be directly mixed into the slurry in which abrasive particles have been mixed.

In the method, the slurry may be produced by mixing a liquid including abrasive particles with another liquid including the activated gas.

In the method, another liquid may be water.

In the method, the gas to be activated may be air, oxygen, an inert gas, a fluorine gas or a mixture thereof.

Preferably, the activated gas is a micro activated gas.

The work polishing apparatus of the present invention comprises:
a slurry supplying section;
a polishing plate having a polishing part, onto which a surface of a work is pressed, with supplying slurry, while rotating the polishing plate so as to polish the work;
a gas discharging section for generating an activated gas by gas discharge; and
a bubble generating section for turning the activated gas, which has been activated by the gas discharging section, into bubbles, and
the activated gas is mixed into the slurry.

In the apparatus, abrasive particles may be mixed into the slurry, and the bubble generating section may directly mix the bubbles of the activated gas with the slurry including the abrasive particles.

In the apparatus, the bubble generating section may mix the bubbles of the activated gas into another liquid, and the slurry, which has been supplied from the slurry supplying section and which includes the abrasive particles, may be mixed with another liquid including the activated gas.

In the apparatus, the gas discharging section and the bubble generating section may be constituted by:
an electrode/gas supplying section being provided in the polishing plate; and
a high-voltage power source for applying high voltage to the electrode/gas supplying section, and
the bubbles of the activated gas, which have been generated by the gas discharging section and the bubble generating section, may be mixed into the slurry, which is supplied onto the polishing plate from the slurry supplying section.

In the present invention, the work can be highly efficiently polished by interaction of the mechanical polishing performed by the abrasive particles and the chemical polishing performed by the gas, which has been activated by gas discharged. Further, the work is polished by not only the mechanical polishing but also the chemical polishing, so the work composed of a high hardness material, e.g., SiC, GaN, diamond, can be suitably polished.

BRIEF DESCRIPTION OF THE DRAWINGS

Embodiments of the present invention will now be described by way of examples and with reference to the accompanying drawings which are given by way of illustration only, and thus are not limitative of the present invention, and in which.

DESCRIPTION OF THE PREFERRED EMBODIMENTS

Preferred embodiments of the present invention will now be described in detail with reference to the accompanying drawings. The method of the present invention is performed in the apparatus thereof, so the method and apparatus will be explained together.

Figure 1:
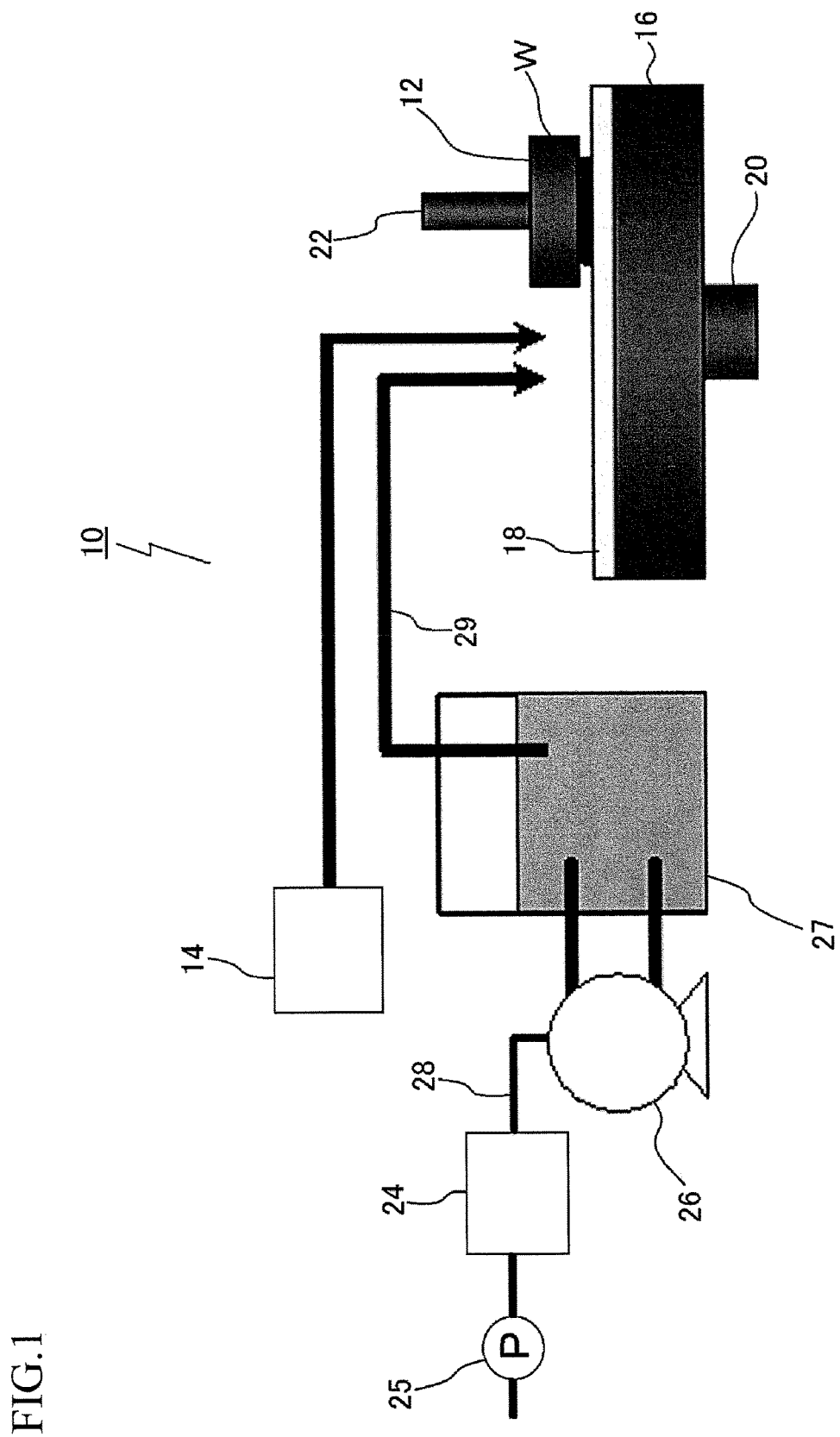
FIG. 1 is an explanation view showing an outline of the work polishing apparatus of a first embodiment.

FIG. 1 is an explanation view showing an outline of the work polishing apparatus 10 of a first embodiment.

In the first embodiment, a surface of a work W held by a polishing head 12 is pressed onto a polishing part 18, which is provided on a rotating polishing plate 16, with supplying slurry from a slurry supplying section 14, so as to polish the surface of the work W. The present embodiment is characterized in that an activated gas, which has been activated by gas discharge, is turned into bubbles and mixed into the slurry.

The polishing plate 16 is rotated, by a driving mechanism (not shown), about a shaft 20, in a horizontal plane. A surface of the polishing plate 16 acts as a polishing part 18. The polishing cloth composed of, for example, unwoven cloth or a polyurethane resin sheet is adhered on the polishing part 18. Further, the polishing part 18 may be formed by embedding special particles in the surface of the polishing plate 16.

The work W is held on a bottom surface of the polishing head 12 by, for example, a double-stick tape or air suction. Various known polishing heads may be employed as the polishing head 12. The polishing head 12 can be moved upward and downward, and rotated about a shaft 22 in a horizontal plane.

The slurry supplying section 14 supplies the slurry, which includes abrasive particles, onto the polishing part 18 of the polishing plate 16. The slurry may be selected from various types of known slurry according to a material of the work W, etc.

A gas is introduced into a gas discharging section 24 by a pump 25, and the gas is turned into plasma so as to generate an activated gas. The gas discharging section 24 turns the gas into plasma by, for example, dielectric-barrier discharge. Note that, the discharging manner of the gas discharging section 24 is not limited to the dielectric-barrier discharge. The gas may be activated by corona discharge, spark discharge, etc. in the gas discharging section 24.

The activating function of the gas discharging section 24 has been known. By turning the gas into plasma, radical species, e.g., OH radical, according to gas species are produced and chemically activated, so that oxidizing function, etching function, etc. can be obtained.

Note that, air, oxygen, an inert gas, a fluorine gas or a mixture thereof can be used as the gas species.

A bubble generating section 26 has a known structure.

Water stored in a tank 27 is introduced into the bubble generating section 26, and the activated gas 26 generated in the gas discharging section 24 is introduced into the bubble generating section 26 via a tube 28, so that the activated gas can be mixed into the water as micro bubbles. The water including the micro bubbles is returned to the tank 27.

The water including the activated gas in the form of micro bubbles is supplied onto the polishing part 18 of the polishing plate 16, via a tube 29, by a pump (not shown), and mixed with the slurry including abrasive particles, which has been supplied from the slurry supplying section 14. Water is resupplied to the tank 27 from a water supplying section (not shown). Note that, the liquid including the activated gas turned into micro bubbles (the micro activated gas) is not limited to water. For example, electrolyzed water, whose pH value has been adjusted, may be used instead of water.

In the bubble generating section 26, the gas activated by gas discharge is turned into micro-nano bubbles. Namely, micro-nano bubble water, in which bubbles of micro (μm) level and bubbles of nano (nm) level are mixed, is produced in the bubble generating section 26. The micro-nano bubble water is supplied onto the polishing part 18 of the polishing plate 16 and mixed with the slurry supplied from the slurry supplying section 14.

Note that, in the above described embodiment, the gas discharging section 24 is separated from the bubble generating section 26, but the both sections may be combined as one unit (not shown). In this case, generating micro-nano bubbles and gas discharge may be simultaneously performed so as to generate the radical species and micro-nano bubbles in the liquid (see, for example, Japanese Laid-open Patent Publication No. 2013-86072). The method and the polishing apparatus in which the gas discharging section 24 and the bubble generating section 26 are combined as one unit is also included in the scope of the present invention (claims 1 and 11).

The slurry supplied from the slurry supplying section 14 and the micro-nano bubble water supplied from the tank 27 are mixed, so that the mixed slurry can be used for polishing the work W.

The slurry supplied from the slurry supplying section 14 includes abrasive particles, and the abrasive particles are highly uniformly dispersed in the mixed slurry by function of the micro-nano bubbles. Therefore, the work W can be uniformly polished.

The gas, which has been activated by gas discharge, is mixed into the micro-nano bubble water in the form of micro-nano bubbles, so that the activated gas directly acts on the surface of the work W. Therefore, the surface of the work W can be oxidized and etched. By the oxidizing function and the etching function, the surface of the work W is metamorphosed, and the metamorphosed layer can be removed by a mechanical polishing function of the slurry including abrasive particles.

Further, many $OH^-$ ions will gather around micro-nano bubbles when micro-nano bubbles are electrically charged. When the charged micro-nano bubbles disappear in the state where many $OH^-$ ions gather therearound, the oxidizing function and the etching function can be obtained by activation of OH radical, and superior effects can be obtained, we think.

In the present embodiment, the work W can be highly efficiently polished by the interaction of the mechanical polishing action of the abrasive particles (the mechanical polishing action uniformly performed by micro-nano bubbles) and the chemical polishing action of the gas activated by gas discharge (e.g., plasma gas). Further, the oxidizing function and the etching function, which are performed by activation of OH radical when the micro-nano bubbles disappear, are added. Since the mechanical polishing and the chemical polishing are performed, high hardness materials, e.g., SiC, GaN, diamond, can be suitably polished.

Figure 2:
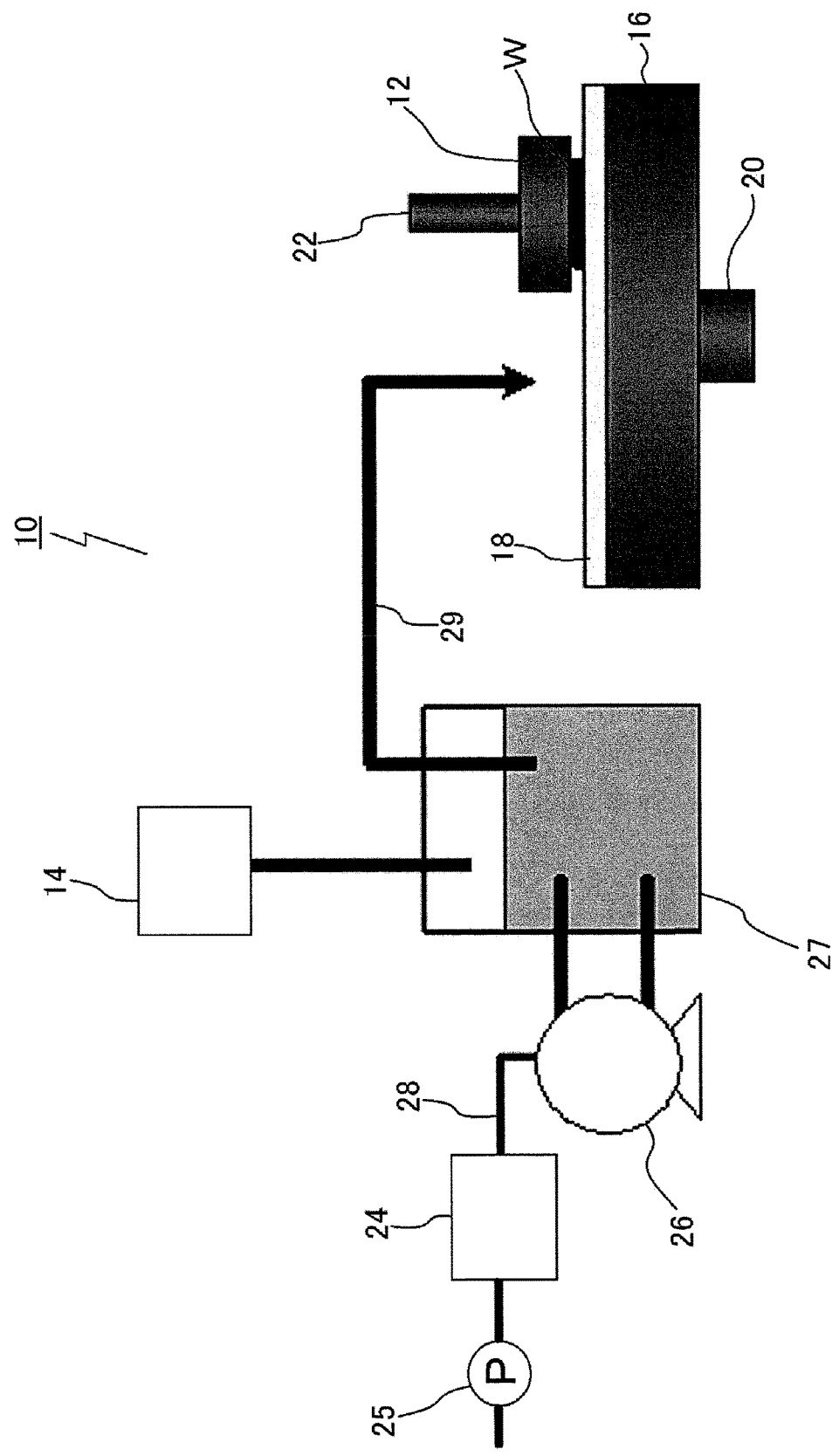
FIG. 2 is an explanation view showing an outline of the work polishing apparatus of a second embodiment.

FIG. 2 is an explanation view showing an outline of the work polishing apparatus 10 of a second embodiment.

The structural elements explained in the first embodiment are assigned the same symbols, and explanation will be omitted.

In the second embodiment, the slurry including abrasive particles is supplied from the slurry supplying section 14 to the tank 27, and the activated gas, which has been turned into plasma and micronized (micro activated gas), is directly mixed into the slurry stored in the tank 27.

In the present embodiment too, the work W can be highly efficiently polished by the interaction of the mechanical polishing action of the abrasive particles (the mechanical polishing action uniformly performed by micro-nano bubbles) and the chemical polishing action of the gas turned into plasma and activated. Further, by performing not only the mechanical polishing but also the chemical polishing, high hardness materials, e.g., SiC, GaN, diamond, can be polished. Further, in the present embodiment, the slurry may be circulated to reuse.

Figure 3:
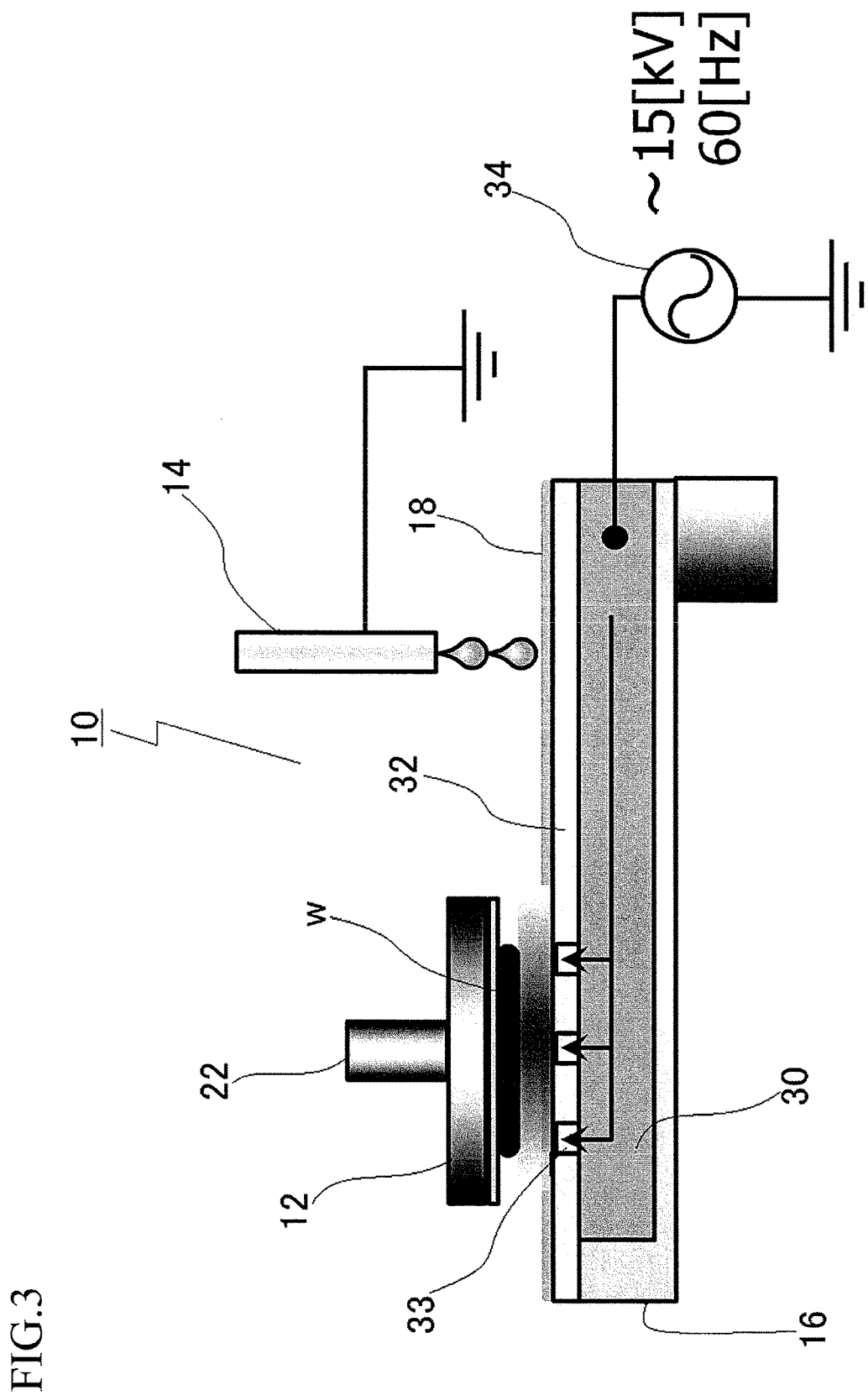
FIG. 3 is an explanation view showing an outline of the work polishing apparatus of a third embodiment.

FIG. 3 is an explanation view showing an outline of the work polishing apparatus 10 of a third embodiment.

The structural elements explained in the first embodiment are assigned the same symbols, and explanation will be omitted.

In the present embodiment, a porous member 30, which is composed of, for example, SUS, is provided in the polishing plate 16 as an electrode/gas supplying section which acts as an electrode and a gas supplying section. A ceramic plate (an insulation plate) 32 covers the porous member 30. In the polishing part 18, the adhered polishing cloth covers the ceramic plate 32. The ceramic plate 32, which faces to the polishing head 12, has many small holes 33.

The polishing head 12 and the slurry (the slurry supplying section 14) are electrically grounded, and a high-voltage power source 34 is connected to the porous member 30, which acts as the electrode/gas supplying section, so as to supply high voltage thereto. Further, a prescribed gas is supplied to the porous member 30 from a gas source (not shown).

The work polishing apparatus 10 of the third embodiment has the above described structure.

In the present embodiment, high voltage is applied from the high-voltage power source 34 to the porous member 30 with supplying the prescribed gas from the gas source (not shown) to the porous member 30. Then, electric discharge is performed between the porous member 30 and the slurry or the work W, and the gas supplied to the porous member 30 is activated, discharged from the porous member 30, turned into bubbles, supplied onto the polishing part (polishing cloth) 18 via the small holes 33 of the ceramic plate 32, and mixed with the slurry, which has been supplied from the slurry supplying section 14 and which includes the abrasive particles. Therefore, the work W can be suitably polished as well as the first and second embodiments.

The gas discharging section and the bubble generating section are constituted by the porous member 30, the high-voltage power source 34, the gas source (not shown), etc.

Note that, in the present embodiment, high voltage is applied to the porous member 30, but high voltage may be applied to the polishing head 12 or the slurry supplying section 14.

In each of the above described embodiments, the polishing apparatus is the one side polishing apparatus, but the present invention can be applied to a double side polishing apparatus.

Next, experimental examples will be explained.

The polishing apparatus 10 shown in FIG. 1 was used in the experiment. Micro-nano bubble water including a micro activated gas, which had turned into plasma and activated, was produced, and a work W composed of a SiC substrate was polished with supplying slurry mixed with the micro-nano bubble water to the polishing cloth (the polishing part 18) of the polishing plate 16.

In the gas discharging section 24, air was flown at a flow rate of 0.3 L/min. and turned into plasma by dielectric-barrier discharge at a high-frequency voltage of 17 kV so as to produce an activated gas. The bubble generating section 26 was a micro-nano bubble generating unit of Type AGS2 manufactured by Asupu Co. Ltd. Sizes of most bubbles were 25-45 μm, but bubbles of nano level were also included.

The used slurry was DSC0902 produced by Fujimi Inc.

The used polishing cloth was SUBA600 manufactured by Nitta Haas Inc.

Figure 4:
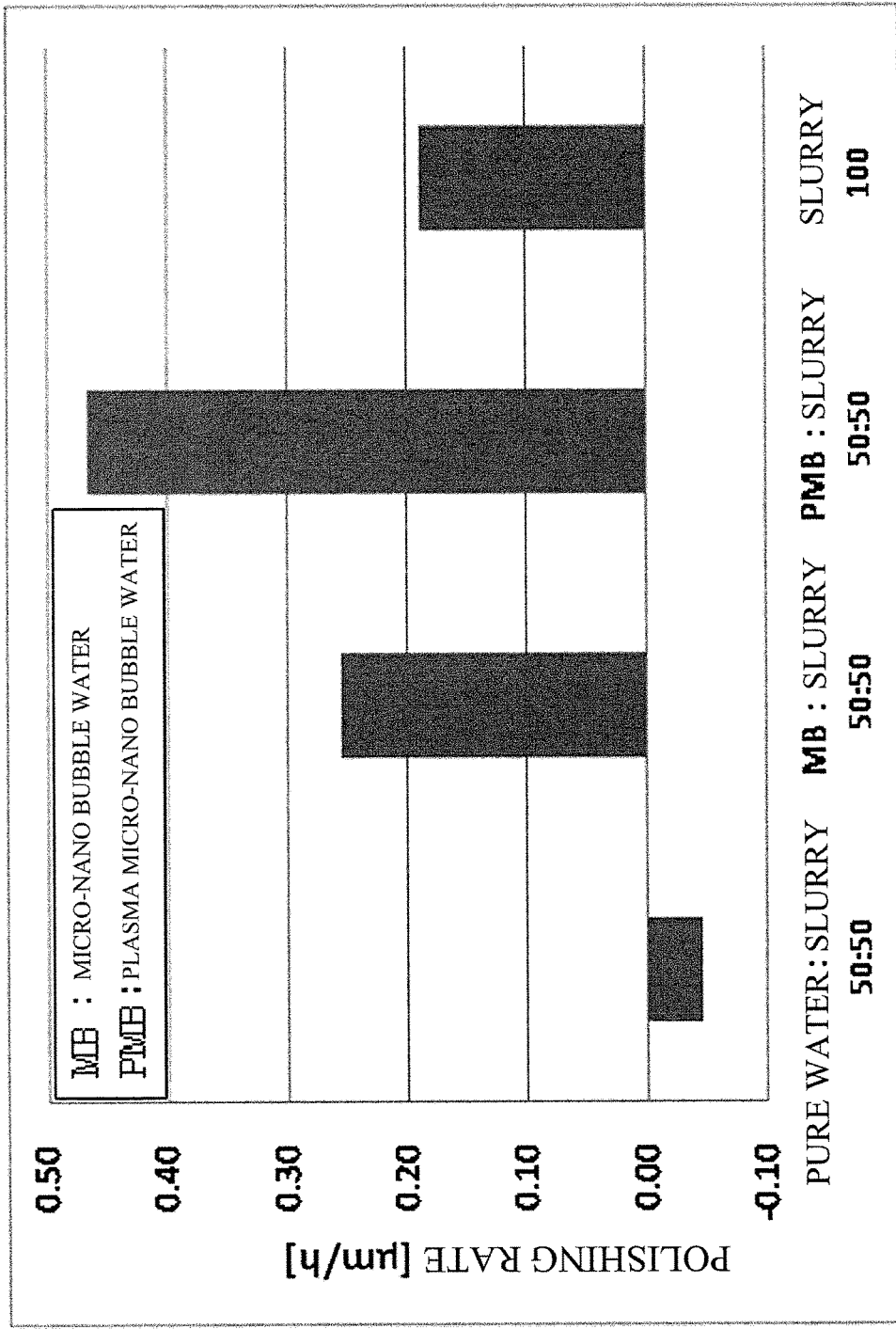
FIG. 4 is a graph showing results of experimental examples.

Experimental results are shown in FIG. 4.

As shown in FIG. 4, a polishing rate of a "polishing liquid including 50% of the plasma micro-nano bubble water and 50% of the slurry" was about two times higher than that of a "polishing liquid including 50% of mere micro-nano bubble water and 50% of the slurry". Note that, the polishing rate of the "polishing liquid including 50% of the mere micro-nano bubble water and 50% of the slurry" was slightly higher than that of the 100% slurry. In case of using a "polishing liquid including 50% of pure water and 50% of the slurry", the slurry was diluted, so polishing function was seldom obtained as a matter of practice.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alternations could be made hereto without departing from the spirit and scope of the invention.

What is claimed is:

1. A polishing apparatus for a work with mechanical polishing function and chemical polishing function, comprising:
    a polishing plate having a polishing cloth, onto which a surface of the work is pressed;
    a slurry supplier for supplying slurry onto the polishing part;
    a gas discharger for generating an activated gas in the form of a plasma with chemical functions of oxidizing and etching to the surface of the work by gas discharge;
    a bubble generator for turning the activated gas, which has been activated by the gas discharger, into micro-nano bubbles with equalizing function in a liquid which is stored in a tank; and
    a pump for supplying the liquid in the tank onto the polishing cloth.

2. The polishing apparatus for a work with mechanical polishing function and chemical polishing function according to claim 1, wherein the gas to be activated is air, oxygen, an inert gas, a fluorine gas or a mixture thereof.

3. The polishing apparatus for a work with mechanical polishing function and chemical polishing function according to claim 1, wherein the slurry contains abrasive particles.

4. A polishing apparatus for a work with mechanical polishing function and chemical polishing function, comprising:
    a polishing plate having a polishing cloth, onto which a surface of the work is pressed;

a slurry supplier for supplying slurry onto the polishing cloth;

an electrode/gas-supplier having a porous member which acts as an electrode and gas supplier, being provided within the polishing plate, for generating a bubble gas with equalizing function; and a high-voltage power source for applying high voltage to the electrode/gas-supplier for generating an activated gas in the form of a plasma with chemical functions of oxidizing and etching to the surface of the work.

5. The polishing apparatus for a work with mechanical polishing function and chemical polishing function according to claim 4, wherein the gas to be activated is air, oxygen, an inert gas, a fluorine gas or a mixture thereof.

6. The polishing apparatus for a work with mechanical polishing function and chemical polishing function according to claim 4, wherein the slurry contains abrasive particles.

7. A polishing apparatus for a work with mechanical polishing function and chemical polishing function, comprising:

a polishing plate having a polishing cloth, onto which a surface of the work is pressed;

a slurry supplier for supplying slurry into a tank;

a gas discharger for generating an activated gas in the form of a plasma with chemical functions of oxidizing and etching to the surface of the work by gas discharge;

a bubble generator for turning the activated gas, which has been activated by the gas discharger, into micro-nano bubbles with equalizing function in the slurry which is supplied into the tank; and a pump for supplying the slurry in the tank onto the polishing cloth.

8. The polishing apparatus for a work with mechanical polishing function and chemical polishing function according to claim 7, wherein the gas to be activated is air, oxygen, an inert gas, a fluorine gas or a mixture thereof.

9. The polishing apparatus for a work with mechanical polishing function and chemical polishing function according to claim 7, wherein the slurry contains abrasive particles.

* * * * *